United States Patent
Ghoshal

(10) Patent No.: US 10,147,860 B2
(45) Date of Patent: Dec. 4, 2018

(54) LIGHTWEIGHT THERMIONIC MICROENGINES FOR AERIAL VEHICLES

(71) Applicant: Reebeez, Inc., Austin, TX (US)

(72) Inventor: Ankita Ghoshal, Austin, TX (US)

(73) Assignee: Reebeez, Inc., Austin, TX (US)

( * ) Notice: Subject to any disclaimer, the term of this patent is extended or adjusted under 35 U.S.C. 154(b) by 0 days.

(21) Appl. No.: 15/133,024

(22) Filed: Apr. 19, 2016

(65) Prior Publication Data

US 2016/0305367 A1    Oct. 20, 2016

Related U.S. Application Data

(60) Provisional application No. 62/149,600, filed on Apr. 19, 2015.

(51) Int. Cl.
*H01L 35/30* (2006.01)
*B64D 27/24* (2006.01)

(52) U.S. Cl.
CPC ........ *H01L 35/30* (2013.01); *B64C 2201/042* (2013.01); *B64D 27/24* (2013.01); *F23M 2900/13003* (2013.01)

(58) Field of Classification Search
CPC ..................................... F02G 5/02; F02G 5/04
See application file for complete search history.

(56) References Cited

U.S. PATENT DOCUMENTS

| | | | | |
|---|---|---|---|---|
| 2,704,434 A * | 3/1955 | Schmitt | ..................... | F02K 3/12 60/263 |
| 3,312,840 A * | 4/1967 | Gabor | ..................... | G21H 1/106 310/306 |
| 6,458,319 B1 * | 10/2002 | Caillat | ..................... | H01L 35/34 374/E7.009 |
| 6,854,273 B1 * | 2/2005 | Lasley | ..................... | F01K 3/18 60/646 |
| 2008/0245398 A1 * | 10/2008 | Bell | ..................... | F02G 1/043 136/224 |
| 2009/0322221 A1 * | 12/2009 | Makansi | ..................... | F25B 21/00 313/523 |
| 2011/0127373 A1 * | 6/2011 | Thomas | ..................... | B64C 1/34 244/65 |
| 2012/0153772 A1 * | 6/2012 | Landa | ..................... | H01J 45/00 310/309 |

OTHER PUBLICATIONS

Goldsby, "Direct Electricity From Heat: A Solution to Assist Aircraft Power Demands", 2010, National Technical Information Service, All Pages.*

(Continued)

*Primary Examiner* — Devina Pillay
*Assistant Examiner* — Daniel P Malley, Jr.
(74) *Attorney, Agent, or Firm* — Travis R. Banta; TechLaw Ventures, PLLC

(57) ABSTRACT

This disclosure generally relates to lightweight thermionic microengines for aerial vehicles. The aerial vehicles include a propulsion system. The propulsion system includes a combustor. The propulsion system further includes a thermionic generator that receives heat from the combustor and generates electricity. The propulsion system further includes one or more propulsion motors that receive the electricity generated by the thermionic generator. The propulsion motors may provide power to one or more propellers to generate lift and thrust for a UAV.

13 Claims, 8 Drawing Sheets

(56) References Cited

OTHER PUBLICATIONS

Xuan, "Combined thermionic-thermoelectric refrigerator", 2002, Journal of Applied Physics, vol. 92, All Pages. (Year: 2002).*
Ding et al., "Optimum performance analysis of a combined thermionic-thermoelectric refrigerator with external heat transfer", 2015, Journal of the Energy Institute, vol. 88, All Pages. (Year: 2015).*
Goldsby, "Direct Electricity From Heat: A Solution to Assist Aircraft Power Demands", 2010, NASA, All Pages. (Year: 2010).*

* cited by examiner

LIGHTWEIGHT THERMIONIC MICROENGINES FOR AERIAL VEHICLES

PRIORITY CLAIM

This application claims priority to U.S. Provisional Application No. 62/149,600 filed on Apr. 19, 2015, which is herein incorporated by reference in its entirety.

BACKGROUND

1. Technical Field

This disclosure relates to lightweight thermionic microengines for aerial vehicles. More specifically, the lightweight thermionic microengines disclosed herein provide a propulsion system for an aerial craft, such as a drone or a UAV (unmanned aerial vehicle), which uses lightweight thermionic microengines to convert energy from chemical based fuel into electricity used to control flight operations the craft.

2. Description of the Related Art

Conventional airplanes, helicopters, and other flying craft have relied on jet engines or internal combustion engines to create the thrust necessary for powered flight. These large aerial vehicles have transformed the world by flying cargo and passengers from one place to another. However, these large aerial vehicles require substantial amounts of fuel in order to produce the thrust necessary to take off and maintain flight.

More recently, unmanned craft have begun taking on flight roles traditionally performed by manned craft. For example, UAVs or drones are used by militaries today to perform reconnaissance, launch weapons, or monitor battle situations without exposing the operator to risk. At the same time, UAVs and drones have been used by hobbyists, cartographers, photographers, civil engineers, treasure hunters, and a host of other professional and amateur operators to provide a point of view of a particular area or object that would be prohibitively expensive, difficult, or dangerous to obtain by a manned craft, such as an airplane or a helicopter.

In virtually every situation, a more lightweight aerial vehicle is desirable over a heavier aerial vehicle because lighter aerial vehicles require less thrust to achieve flight, all other considerations being equal. Since the amount of thrust produced is directly proportional to the energy expended, the lightest aerial vehicle that will perform a particular task is typically best. Since the weight of a propulsion system is a significant fraction (20-40%) of the total weight of a UAV, it is desirable that the propulsion system weigh as little as possible. Further, it is desirable for the UAV fuel or energy storage device to have a high specific energy content, or in other words, a relatively high energy output to mass ratio. Further, the less energy that is expended for propulsion of an UAV from chemical based fuels or electricity, the longer an aerial vehicle can maintain flight and the farther the aerial vehicle can travel without refueling.

Engines derive energy from the heat of combustion of chemical fuels such as hydrocarbons (natural gas, butane, and gasoline) or hydrogen. The specific energy of hydrocarbon fuels (say, butane) is 45 MJ/kg (12.5 kWh/kg), and that of hydrogen is 140 MJ/kg (38.9 kWh/kg). Specific energy of chemical fuels are about hundred times greater than state-of-the-art battery technologies. Lithium polymer (LiPo) batteries, which are commonly used in drones, have low specific energies (<0.17 kWh/kg). However, engines such as jet engines and internal combustion engines, utilized to convert energy in chemical fuels to propeller power are heavy and cannot be scaled down in size because of poor reliability and high cost of manufacturing.

In order to reduce weight, many UAVs and drones use batteries or sodium borohydride ($NaBh_4$) fuel cells to provide the power necessary to create sufficient thrust for flight. However, batteries are also subject to a host of limitations. For example, although advanced batteries such as lithium-ion, lithium polymer (LiPo), and other batteries provide power suitable to create enough thrust for a UAV or a drone to fly, batteries in general are expensive, have low specific energies, low power densities, short cycle lives, long charging times, are sensitive to adverse weather and humidity conditions, can be toxic, and, in many cases, have a generally adverse effect on the environment in terms of manufacture and disposal. Many UAV and drone operators find that these limitations limit their ability to use or their enjoyment in using and operating a UAV or drone. Further, these limitations provide powered flight for a disappointingly short amount of time, even with very small, often inadequate payloads.

Accordingly, it is one object of this disclosure to provide lightweight thermionic microengines and robust propulsion power system for aerial vehicles such as UAVs and drones. It is another object of this disclosure to overcome the limitations of conventional battery technology while providing thrust to an aerial vehicle by means of electric power. It is another object of this disclosure to enhance a UAV or drone operator's flight experience by providing a propulsion system that increases flight time and load capacity.

It is a further object of this disclosure to provide a propulsion system that does not rely on electrical power provided from an electrical grid. Yet another object of this disclosure is to increase the payload capacity of a drone that operates by means of electrical power.

SUMMARY

Disclosed herein is a lightweight thermionic microengine for aerial vehicles. The aerial vehicles include a propulsion system. The propulsion system includes a combustor. The propulsion system further includes a thermionic generator that receives heat from the combustor and generates electricity. The propulsion system further includes one or more propulsion motors that receive the electricity generated by the thermionic generator. The propulsion motors may provide power to one or more propellers to generate lift and thrust for a UAV.

In another embodiment, the propulsion system may include a combustor, a thermophotovoltaic generator, a thermionic generator, a thermoelectric generator and one or more propulsion motors. The thermophotovoltaic generator creates electricity from radiation received from an emitter. The thermionic generator receives heat from the combustor and generates electricity. The thermoelectric generator receives heat from the combustor and generates electricity. Finally, the one or more propulsion motors are electrically connected to the thermophotovoltaic generator, the thermionic generator, and the thermoelectric generator.

Also disclosed herein is a thermionic microengine. The thermionic microengine includes a combustor, one or more thermionic generators, and a DC-DC converter.

BRIEF DESCRIPTION OF THE DRAWINGS

The accompanying drawings illustrate an embodiment of a propulsion power system for aerial vehicles which incorporate a lightweight thermionic microengine.

DETAILED DESCRIPTION OF PREFERRED EMBODIMENTS

In the following description, for purposes of explanation and not limitation, specific techniques and embodiments are set forth, such as particular techniques and configurations, in order to provide a thorough understanding of the device disclosed herein. While the techniques and embodiments will primarily be described in context with the accompanying drawings, those skilled in the art will further appreciate that the techniques and embodiments may also be practiced in other similar devices.

Reference will now be made in detail to the exemplary embodiments, examples of which are illustrated in the accompanying drawings. Wherever possible, the same reference numbers are used throughout the drawings to refer to the same or like parts. It is further noted that elements disclosed with respect to particular embodiments are not restricted to only those embodiments in which they are described. For example, an element described in reference to one embodiment or figure, may be alternatively included in another embodiment or figure regardless of whether or not those elements are shown or described in another embodiment or figure. In other words, elements in the figures may be interchangeable between various embodiments disclosed herein, whether shown or not.

Figure 1:
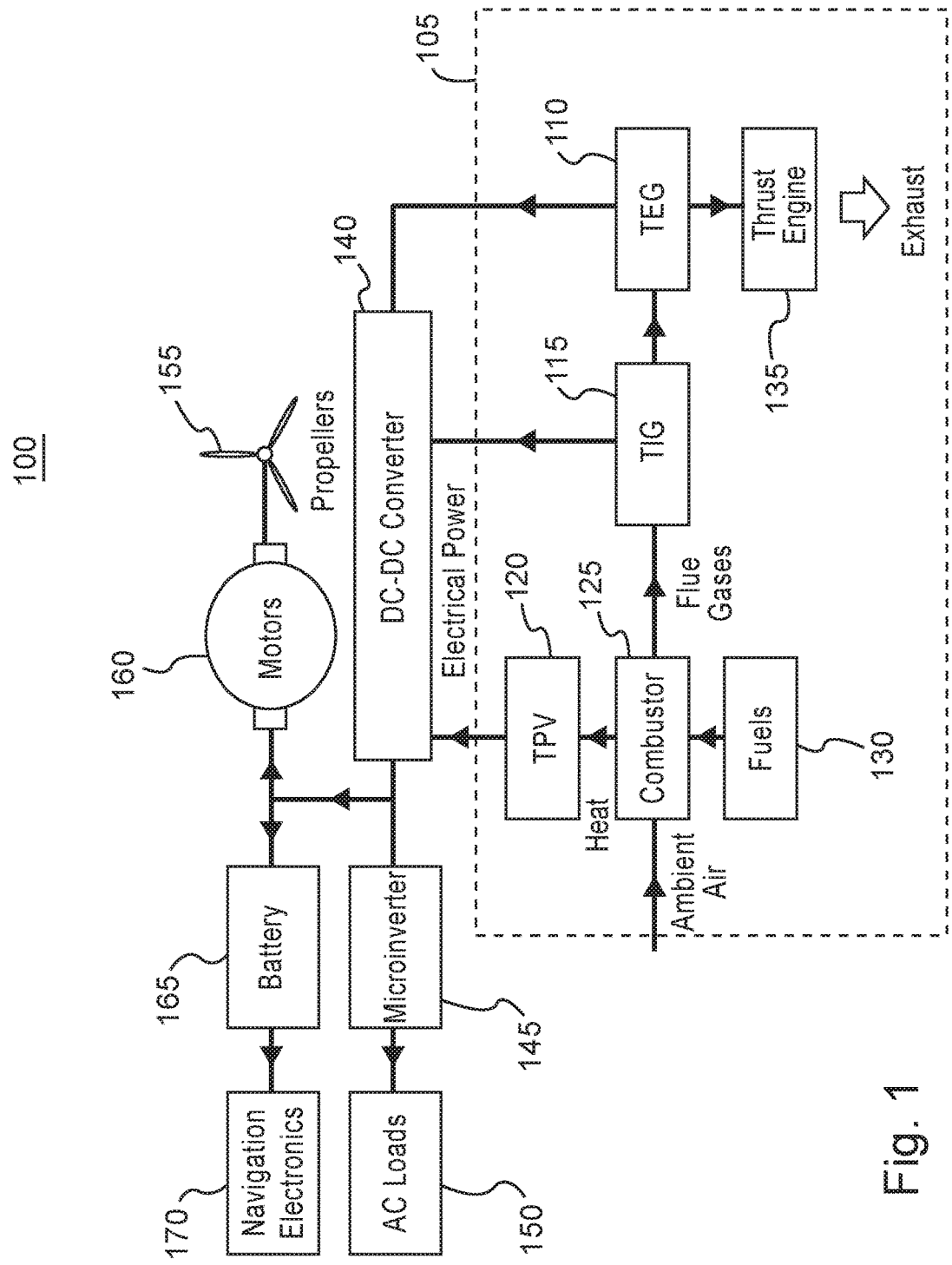
FIG. 1 illustrates a block diagram of an aerial vehicle, which incorporates a lightweight thermionic microengine propulsion system.

FIG. 1 illustrates a block diagram of an aerial vehicle 100, which incorporates a lightweight thermionic microengine propulsion system 105. Aerial vehicle 100 may be implemented as a UAV (unmanned aerial vehicle) that may be more commonly referred to as a drone. Aerial vehicle 100 is an unmanned flying craft, the flight controls of which are typically managed by a wireless communication connection between a ground-based controller operating an aerial vehicle control device and aerial vehicle 100. Hosts of wireless communication connections may be established between the aerial control device and aerial vehicle 100, both secured (encrypted) and unsecured (unencrypted). Aerial vehicle 100 includes a lightweight thermionic microengine propulsion system 105 in order to provide power to create the thrust required for powered flight of aerial vehicle 100. In this embodiment, lightweight thermionic microengine propulsion system 105 includes a thermoelectric generator ("TEG") 110, a thermionic generator 115 ("TIG"), and a thermophotovoltaic generator ("TPV") 120. TEG 110 is a device with n-type and p-type semiconductor legs, which is explained in more detail below, and which converts heat into electricity by electronic transport. TIG 115 is a device with vacuum electronics cells and p-type semiconductor legs, which will also be explained in more detail below, and which converts heat into electricity. TPV 115 is a device, which will also be explained in more detail below, and which converts radiation and heat into visible and infrared light and then converts the light into electricity using photovoltaic cells. The term "photovoltaic" as used herein refers to electrical devices that convert light into electricity, much like a conventional solar panel. In lightweight thermionic microengine propulsion system 105, ambient air may be drawn into a combustor 125 by entrainment to facilitate combustion of chemical based fuel contained within a fuel tank 130.

Fuel tank 130 may contain any chemical based fuel suitable for use with lightweight thermionic microengine propulsion system 105. For example, chemical based fuels suitable for use with lightweight thermionic microengine propulsion system 105 include natural gas, butane, gasoline, hydrogen, methane, propane, any other liquid or gaseous hydrocarbon, carbon monoxide, ethanol, kerosene, and any mixture or combination of these fuels in any proportion. As fuel from fuel tank 130 is released at high pressure into combustor 125, air is entrained such that the air/fuel mixture is completely or nearly completely combusted. The product of this combustion is radiation and remnant heat, generated by flames as the fuel is burned and hot gas exhausted (air and combustion products such as carbon dioxide and steam), also referred to as flue gases. The flue gases are exhausted into TEG 110 and TIG 115 while radiation and remnant heat generated within combustor 125 is transferred into TPV 120. TEG 110 and TIG 115 generate DC (direct current) electricity from the heat in the flue gases exhausted by combustor 125. In embodiments of aerial vehicle 100 without TPV 120, TIG 115 may heated by both radiation and flue gases. TPV 120 generates DC electricity from radiation and remnant heat within combustor 125 by first converting the radiation into visible and infrared light and then generating electricity using photovoltaic cells within TPV 120. In one embodiment, combustor 125 may further implement a recuperator, not shown, to harvest heat that may otherwise be wasted and preheat the entrained air entering the combustor to increase the overall efficiency of lightweight thermionic microengine propulsion system 105. Lightweight thermionic microengine propulsion power system 105 may further include a thrust engine 135 which controls a direction of thrust for aerial vehicle 100 by exhausting the flue gases in a particular direction.

DC electricity generated by TEG 110, TIG 115, and TPV 120 is provided into a DC-DC converter 140 (direct current to direct current converter). DC-DC converter 140 acts as a transformer to either reduce or increase the voltage received from TEG 110, TIG 115, and TPV 120. In one embodiment, one or more motors 160 may operate at a voltage higher than the voltage level supplied by TEG 110, TIG 115, and TPV 120, in which case DC-DC converter 140 increases the voltage level by reducing the overall electrical current supply according to known electrical principles. Similarly, one or more motors 160 that operate at a voltage lower than the voltage level supplied by TEG 110, TIG 115, and TPV 120 are supplied by DC-DC converter 140 with voltage that is lower than the voltage level supplied by TEG 110, TIG 115, and TPV 125 by increasing the overall electrical current supply according to known electrical principles. DC-DC converter 140 is connected to microinverter 145, battery 165, and one or more motors 160 and supplies DC electricity at a particular voltage to one or more of microinverter 145, battery 165, and one or more motors 160. Accordingly, TEG 110, TIG 115, and TPV 120 are electrically connected, directly or indirectly, to one or more motors 160 and provide electrical power for the motors to create lift and thrust using known techniques.

In one embodiment, a microinverter 145 may be provided to transform direct current electricity into alternating current ("AC") electricity for AC loads 150. For example, if aerial vehicle 100 carried a payload that required cooling, an AC load 150 may implement a cooling device to cool the payload. Any device that requires alternating current for electricity may be implemented as AC load 150 and supplied with AC electricity through microinverter 145.

Battery 165 may be used to supply electricity to navigation and control electronics 170. Navigation and control electronics 160 interact with the aerial vehicle control device operated by a ground-based controller to provide flight control to the ground-based controller. Controls in the aerial control device may include throttle control of one or more motors, pitch, yaw, and thrust angles of aerial vehicle 100. Other control may be exerted by automation. For example, a smart drone may have the ability to receive and interpret global positioning information (GPS) from satellites and fly between two or more points autonomously.

Battery 165, which in some cases may be implemented as a supercapacitor, may further store enough electricity to provide a ground-based controller with enough time to safely land aerial vehicle 100 in the event of an emergency. For example, if the fuel supply within fuel tank 130 became depleted by use, battery 165 may provide power to motors 160 to allow a ground based controller to safely land aerial vehicle 100 without damage. Other emergencies include technical failures, clogged or malfunctioning entrainment devices, tainted fuel conditions, and a host of other examples.

One or more motors 160 receive electricity from DC-DC converter 140 or battery 165. The one or more motors 160 may include thrust devices 155 that spin at high speed to produce lift and thrust for aerial vehicle 100. In many embodiments, thrust device 155 will be implemented as a propeller. However, other thrust devices may be possible using jet based technologies or other technologies that direct air in a particular direction to produce thrust or lift.

Figure 2:
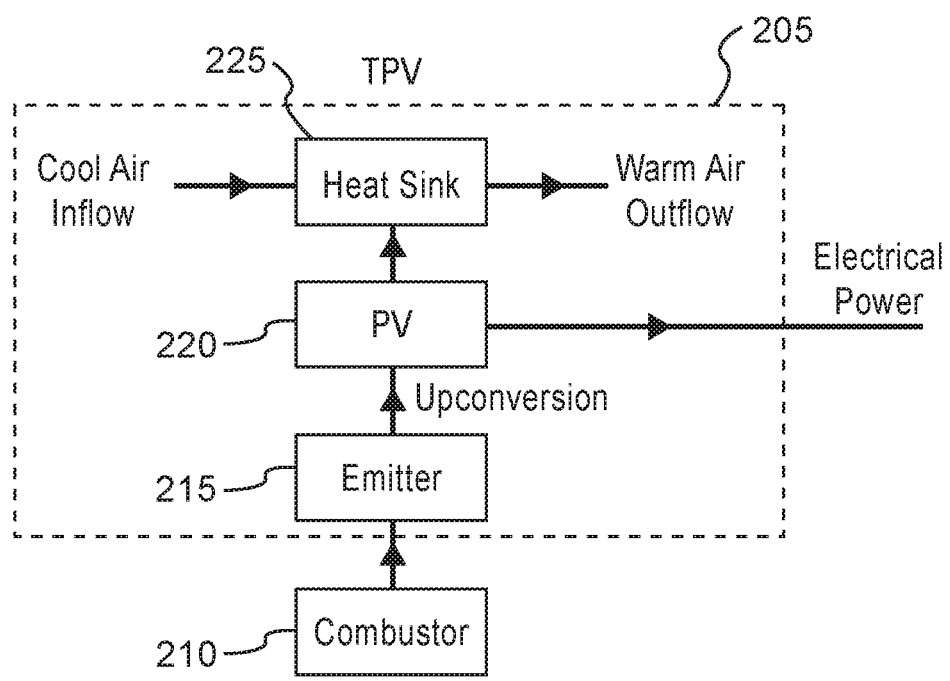
FIG. 2 illustrates a thermophotovoltaic electrical generator incorporated in a lightweight thermionic microengine propulsion system.

FIG. 2 illustrates a thermophotovoltaic electrical generator 205 ("TPV 205") used in propulsion power system 200. Propulsion power system 200 includes a combustor 210 that functions in a manner similar to that discussed above with respect to combustor 125 in FIG. 1. TPV 205 includes an emitter, 215, one or more photovoltaic cells 220, and a heat sink 225. In general, TPV 205 converts radiation emitted from one or more flames and heat in the combustor into electrical energy. When the emitter 215 is heated by the radiation and heat, emitter 215 emits low wavelength visible or near infrared light that can be converted to electricity by photovoltaic cells 220. Heat sink 225 maintains the photovoltaic cells 220 at an ambient temperature to maximize the efficiency of conversion of the radiation into electricity.

Combustor 210 releases fuel at high pressure through nozzles that entrain air with the fuel. In other words, combustor 210 mixes fuel with air to create a combustible gas. Alternatively, combustor 210 can be supplied with a pre-mixed oxygen-rich fuel to promote complete combustion of the fuel and therefore obtaining the most efficient (brightest and/or hottest) flame available. As fuel is burned within combustor 210, the flames in combustor 210 may create heat at a temperature in excess of 1500° C., and potentially up to 2500° C.

Emitter 215 is implemented using refractory metals such as Molybdenum (Mo), Niobium (Nb), Tantalum (Ta), or Tungsten (W). These refractory metals may be fashioned into a metal mesh, a metal foil, or implemented as photonic crystals and may be layered with rare earth element oxides such as Ytterbia ($Yb_2O_3$) and Erbia ($Er_2O_3$); semiconductors such as Silicon Carbide (SiC), or Molybdenum Disilicide ($MoSi_2$); metamaterials made of rare earth element oxides, platinum group elements on the Periodic Table of Elements; and other refractory metals. Whether implemented as a mesh or photonic crystals, emitter 215 is fashioned as an optical nanostructure that selectively affects the motion of photons in light. Accordingly, emitter 215 is a "tuned" frequency upconverter transducer, in a manner of speaking, which actively transforms the broadband radiation and long wavelength infrared light emitted from the flame within combustor 210 to shorter wavelength visible light and near infrared light. The emission spectra of the emitter 215 is dominated by visible light wavelengths that are matched to the radiation absorption characteristics of one or more photovoltaic cells 220. In one embodiment with rare earth element oxide emitters, emitted light with a frequency in the range of 500 nm-1000 nm is preferable for exposure to one or more Silicon (Si) or Gallium Antimonide (GaAs) photovoltaic cells 220, with a visible light wavelength of approximately 750 nm being ideal. In another embodiment with refractory metals, emitted light with a frequency in the range of 1000 nm-1500 nm is preferable for exposure to one or more Gallium Antimonide (GaSb) photovoltaic cells 220. Accordingly, preferable frequency ranges for light emitted by rare earth element oxide emitters typically fall between 500 nm and 1500 nm. In order to further enhance the efficiency of the emitter, thin films of platinum may be implemented as a reflector material that serves to reflect very long wavelength radiation back into combustor 210. Thus, emitter 215 transforms radiation from combustor 210 to shorter wavelength light such that the quantum efficiency of conversion from photons to electrons is maximized for one or more photovoltaic cells 220.

This process, of selectively transforming broadband long wavelength radiation with emitter 215, may be referred to as an upconversion because only light of a higher frequency (and therefore smaller wavelength) is emitted through the mesh or photonic crystals in emitter 215 to stimulate the production of electricity in one or more photovoltaic cells 220. Frequency upconversion for radiation from combustor 210 is desirable because the quantum efficiency of converting photons to electrons by one or more photovoltaic cells 220 is substantially increased, increasing the efficiency of the one or more photovoltaic cells 220. More simply put, emitter 215 acts as an intensity magnifier by emitting portions of light that are most efficient for conversion into electricity by one or more photovoltaic cells 220 based on the radiation received from combustor 210.

One or more photovoltaic cells 220 within TPV 205 are typically made of semiconductors that include Silicon (Si), Gallium Antimonide (GaSb), or InGaAsSb (a molecule comprising Indium, Gallium, Arsenic, and Antimony) or multi-junction photovoltaic cells such as Aluminum Gallium Indium Phosphide (AlInGaP) or Gallium Arsenide (GaAs) solar cells. One or more photovoltaic cells 220 convert light emitted by emitter 215 into electrical energy as electricity. Because the temperature of the combustor is fairly high, the one or more photovoltaic cells 220 may be thermally isolated from heat that may be transferred into or through emitter 215 by the use of a sapphire wafer and/or silica aerogels. Both sapphire wafers and silica aerogels allow shorter wavelength visible light emitted by emitter 215 to pass through unimpeded to the one or more photovoltaic cells 220 while at the same time reducing the transmission of heat to the one or more photovoltaic cells 220. However, at the same time, heat is created when the one or more photovoltaic cells 220 create electricity from received light. Accordingly, a heat sink 225 is provided to dissipate heat created by the one or more photovoltaic cells 220. Heat sink 225 provides a heat exchanger that allows cool ambient air to flow through a series of metal fins, which carry heat away from TPV 205. Heat sink 225 may be further implemented using fluidic cooling system and/or heat pipes.

Figure 3:
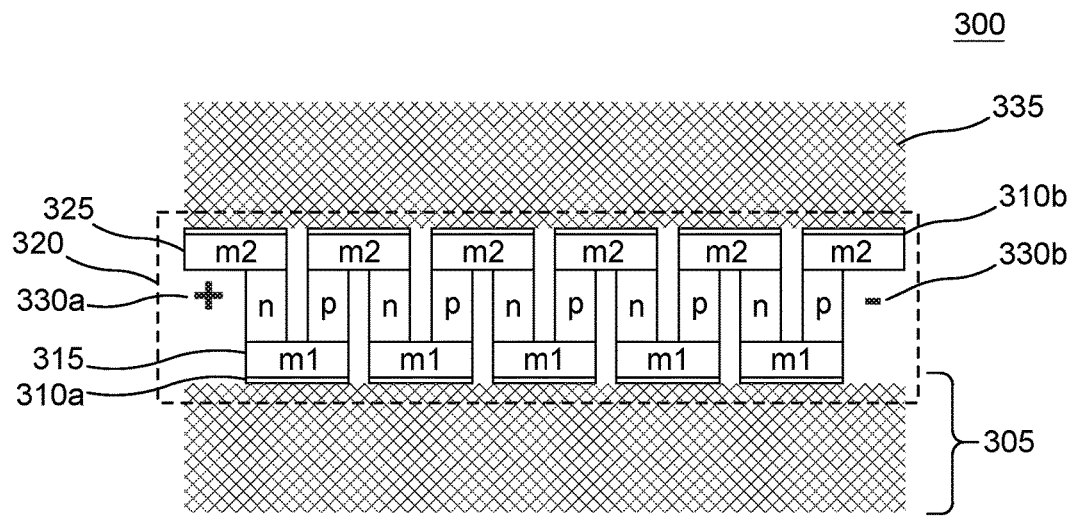
FIG. 3 illustrates a thermoelectric generator of a propulsion power system.

FIG. 3 illustrates a thermoelectric generator 300 ("TEG 300") used in a propulsion power system. As discussed above with respect to FIG. 1, flue gases are exhausted from combustor 125 into TEG 110, which is similar to TEG 300. Accordingly, TEG 300 includes a high temperature heat exchanger 305 that extracts heat from the flue gases exhausted from, for example, combustor 125 shown in FIG. 1. High temperature heat exchanger 305 may be constructed using materials with high thermal conductivity such as Silicon Carbide (SiC), Silicon (Si), and Aluminum Nitride, (AlN), refractory metals such as Molybdenum (Mo) and Tungsten (W), or platinum coated copper-nickel foams that are stable at high temperatures. Low temperature heat exchanger 335 may be implemented using any high thermal conductivity foam or heat sink including carbon and aluminum foams.

TEG 300 converts this heat into electricity through the use of thermoelectric couples 320, which are disposed between metal links 315 (referred to in FIG. 3 as m1) and metal links 325 (referred to in FIG. 3 as m2), which are in turn disposed between a first electrically insulated layer 310a and a second electrically insulated layer 310b. First electrically insulated layer 310a and second electrically insulated layer 310b may be constructed from thin (<10 micrometers) anodized aluminum or silicon dioxide (SiO$_2$)/Silicon (Si) and may be otherwise electrically insulated while still allowing for thermal conduction between, for example, high temperature heat exchanger 305 and first electrically insulated layer 310a.

Metal links 315 and metal links 320 may be constructed using the same or different materials as suitable for a particular implementation. For example, metal links 315 may be composed from a first one of a plated copper/nickel/gold material (Cu/Ni/Au), a plated nickel material (Ni), a plated nickel/gold material (Ni/Au), plated gold material (Au), and refractory metals such as Molybdenum (Mo), Tungsten (W), Tantalum (Ta), or Titanium (Ti) while metal links 320 may be constructed using the first one of the foregoing materials or a second one of the foregoing materials. Numerous combinations are possible and may be implemented as necessary for a specific application.

Thermoelectric couples 320 are configured as pairs of N-type and P-type thermoelectric legs in an electrically series, thermally parallel configuration. Thermoelectric couples 320 generate a voltage across a load resistor when subjected to a temperature gradient, as per the Seebeck effect. The N-type and P-type thermoelectric legs in the TEG 300 are based on high temperature semiconductors that have high Seebeck coefficient S, high electrical conductivity σ and low thermal conductivity λ. These characteristics result in a high thermoelectric figure of merit, referred to as ZT. $ZT=\sigma S^2 T/\lambda$, where temperature T is the average temperature across the thermoelectric leg. N-type thermoelectric legs may be implemented as skutterudite materials such as Yb—Ba—Co—Sb systems (Ytterbium, Barium, Cobalt, Antimony); lead chalcogenide systems such as Pb—Te (Lead-Tellurium) and Pb—Se (Lead-Selenium); half-heusler compositions such as Hf—Ni—Sn—Sb systems (Halfium, Nickel, Tin, Antimony); rare earth tellurides such as La—Te systems (Lanthanum-Tellurium); or semiconductors such as Indium Antimonide (InSb); and Silicon (Si) and Phosphorus (P) doped Silicon-Germanium (SiGe) systems. P-type thermoelectric legs may be implemented as skutterudite materials such as Ce—Fe—Co—Sb systems (Cerium, Iron, Cobalt, Antimony); lead chalcogenide systems such as Pb—Te (Lead-Tellurium); half-Heusler compositions such as Zr—Co—Sn—Sb systems (Zirconium, Cobalt, Tin, Antimony); Si—Ge—C (Silicon, Germanium, Carbon) systems; Zintyl compounds such as Yb—Mn—Sb systems (Ytterbium, Manganese, Antimony); semiconductors such as Zn—Sb (Zinc, Antimony); and Boron (B) doped Si—Ge (Silicon, Germanium) systems. These materials may be ball-milled to produce nanostructured grains and compacted using spark plasma sintering or deposited by thin film PVD or Chemical Vapor Deposition (CVD) techniques.

Accordingly, when heat is applied to thermoelectric couples 320, it is transported from the hot side to the cold side by electrons in the N-type legs and the holes in the P-type legs, thereby setting an electrical voltage and current across an external electrical load. The voltage across a load resistor is proportional to the temperature differential across the legs, as per the Seebeck effect. The thermoelectric couples 320 are disposed between first electrically insulated layer 310a and second electrically insulated layer 310b.

Accordingly, electrical current flows within TEG 300 as heat is applied to thermoelectric couples 320. More specifically, DC electricity with a high voltage is produced at terminal 330a while DC electricity with a low or zero voltage is produced at terminal 330b. Thus, DC electricity flows from low voltage at terminal 330b to the higher voltage at terminal 330a. Excess heat captured by heat exchanger 305 that cannot be converted into electricity for efficiency reasons may be conducted into low temperature heat exchanger 335 and dissipated into ambient air.

Thus, as a UAV using the lightweight thermionic power propulsion system of FIG. 3 flies, hot flue gases are exhausted into high temperature heat exchanger 305 to produce electricity while any excess heat is dissipated into the ambient air by heat exchanger 335 as the UAV flies.

Figure 4:
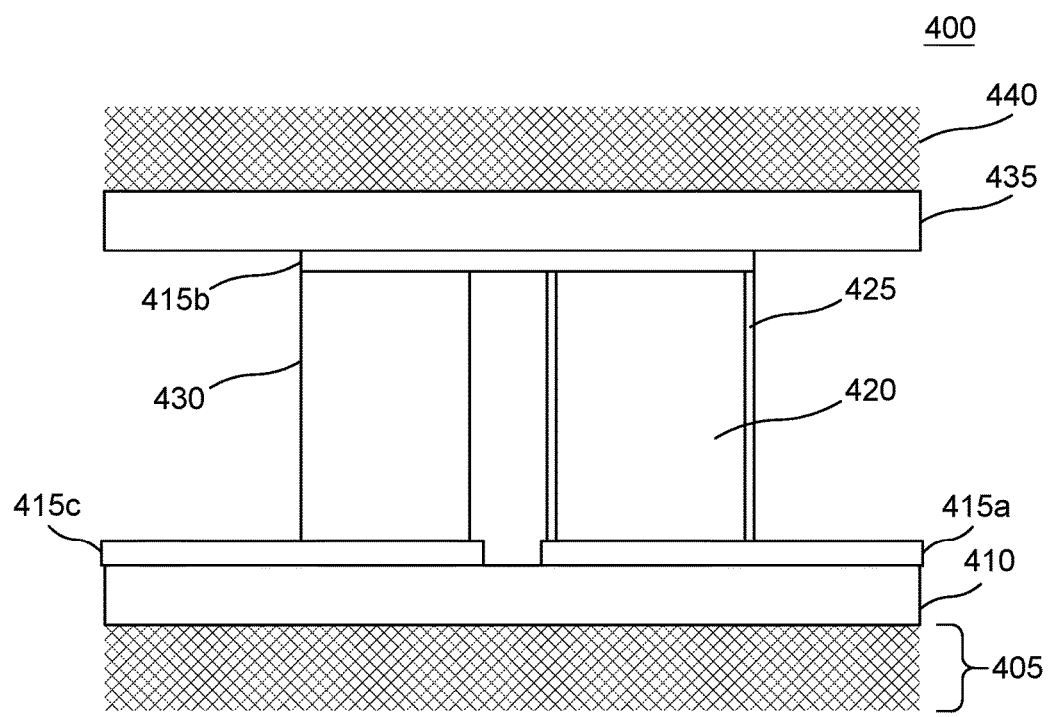
FIG. 4 illustrates a first embodiment of a TIG structure using a single cell.

FIG. 4 illustrates a first embodiment of a TIG structure 400 using a single cell. An embodiment of TIG structure 400 replaces n-type legs of a TEG with a vacuum electronics cell 420. In other words, TIG structure 400 may be implemented using only P-type thermoelectric legs and without implementing any N-Type thermoelectric legs. TIG structure 400, as explained below, creates electrical power by converting heat into electricity. More specifically, thermal energy absorbed into a high temperature heat exchanger 405 allows electrons from the high temperature heat exchanger 405 side of TIG structure 400 to overcome the metal work function and "evaporate" to a low temperature heat exchanger 440 side of TIG structure 400. The electrode defined by refractory metal 415a at the high temperature heat exchanger 405 side of TIG structure 400 may be referred to as a cathode while the electrode defined by refractory metal 415b at the low temperature heat exchanger 440 side of TIG structure 400 may be referred to as an anode. High temperature heat exchanger 405 which is similar in both design and explanation to high temperature heat exchanger 305 shown in FIG. 3. TIG structure 400 further includes a high temperature substrate 410 which is thermally connected to high temperature heat exchanger 405. High temperature substrate 410 may be composed using any material that is stable at high temperature and has a low coefficient of thermal expansion. Exemplary materials for high temperature substrate 410 include Silicon Carbide (SiC), Aluminum Nitride (AlN), alumina, sapphire, Silicon (Si), and quartz.

TIG structure 400 further includes refractory metals, such as refractory metal 415a, 415b, and 415c which act as electrodes for TIG structure 400. Refractory metals 415a and 415c are thermally connected to high temperature substrate 410 while refractory metal 415b is thermally connected to a low temperature substrate 435. Refractory metals 415a-415c may be constructed using any material that is stable at high temperature that also conducts electricity. Exemplary materials for refractory metals 415a-415c include Molybdenum (Mo), Tungsten (W), Niobium (Nb), Platinum (Pt), Iridium (Ir), and Tantalum (Ta). Refractory metals 415a and 415c may be electrically separated or electrically insulated from each other even while both being thermally connected to high temperature substrate 410.

In the embodiment of TIG structure 400 shown in FIG. 4, a vacuum electronics cell 420 is created between refractory metal 415a and refractory metal 415b. Vacuum electronics cell 420 is created by vacuum electronics cell walls 425 which are formed using low conductivity materials such as quartz, alumina, or sapphire. Vacuum pressures within vacuum electronics cell 420 may typically be rated at less than $10^{-6}$ Pascals. It should also be noted that a partial vacuum may be sufficient for vacuum electronics cell 420, so long as the vacuum pressure within vacuum electronics cell 420 is sufficient to avoid oxidation of refractory metal 415a and refractory metal 415b and to allow electron transport between refractory metal 415a and refractory metal 415b.

TIG structure 400 further includes a P-type thermoelectric leg 430 disposed between refractory metal 415b and refractory metal 415c. A P-type thermoelectric leg is similar to any one of the P-type thermoelectric legs described above with respect to FIG. 3. P-type thermoelectric leg 430 essentially completes the circuit and allows electrical current to flow. P-type thermoelectric leg 430 also minimizes heat leakage due to the current leads connecting to the low temperature heat exchanger 440 side of TIG structure 400. Thermionic energy conversion is most efficient at temperatures exceeding 1000° C. when thermionic energy emission currents are relatively large. Accordingly, the figure of merit for thermionic converter efficiency must be optimized to create the maximum amount of electrical current per unit of heat absorbed by heat exchanger 405. The figure of merit depends on the sum of the electrode work functions which is typically between 1.1 and 1.5 eV and the voltage gap required to mitigate negative charge buildup (also referred to as "space charge") from electrons emitted from the cathode defined by refractory metal 415a of TIG structure 400.

Refractory metal 415b is thermally connected to low temperature substrate 435 which may be constructed from the same materials described above with respect to high temperature heat exchanger 405. Low temperature substrate 435 may also be thermally connected to low temperature heat exchanger 440 which is also similar in both design and explanation to low temperature heat exchanger 335, shown in FIG. 3. Low temperature heat exchanger 440 may dissipate excess heat that was not converted into electricity because of inherent inefficiencies in the creation of electricity from thermal energy.

Accordingly, as high temperature heat exchanger 405 is heated by the exhaust from combustor 125, for example, heat is absorbed and exposed to a P-type thermoelectric leg 430 and a vacuum electronics cell 420. The temperature differential between the cathode defined by refractory metal 415a and the anode defined by refractory metal 415b of TIG structure 400 causes electron transport to occur, which creates an electrical current. Multiple TIG structures 400 may be formed in an electrically-series thermally parallel configuration to increase the electrical power which may be delivered to a DC-DC converter, such as DC-DC converter 140, shown in FIG. 1. This electricity may be used to power one or more discrete elements of a UAV.

Figure 5:
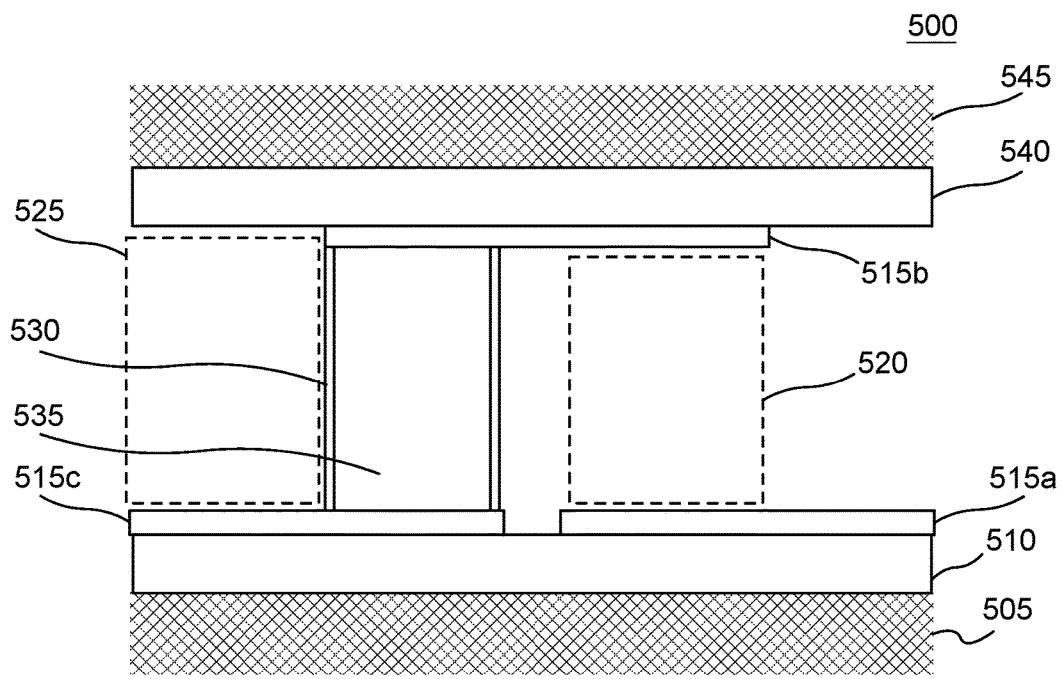
FIG. 5 illustrated an alternative embodiment of the TIG structure shown in FIG. 4 disposed within a sealed vacuum package.

FIG. 5 illustrates an alternative embodiment of TIG 500, which is similar to TIG structure 400 shown in FIG. 4 and disposed within a sealed vacuum package. TIG 500 includes high temperature heat exchanger 505 which is similar in design and description to high temperature heat exchanger 405, shown in FIG. 4. TIG 500 also includes a high temperature substrate 510 which is similar in design and description to high temperature substrate 410, shown in FIG. 4. TIG 500 further includes refractory metals 515a, 515b, and 515c which are also similar in design and description to refractory metals 415a, 415b, and 415c, shown in FIG. 4. TIG 500 also includes a vacuum electronics cell 520 which is similar in design and description to vacuum electronics cell 420, shown in FIG. 4.

In TIG 500, a P-type thermoelectric leg 535 is electrically insulated from TIG 500 by an electrical insulator 530. P-type thermoelectric leg 535 is otherwise similar in design and description to P-type thermoelectric leg 430 shown in FIG. 4. However, electrical insulator 530 provides the additional advantage of connecting a plurality of thermionic cells in an electrically-series, thermally parallel array within a sealed vacuum package. In FIG. 5, a second vacuum cell 525 is disposed adjacent to P-type thermoelectric leg 530 within a vacuum environment in a sealed vacuum package which facilitates disposing a plurality of individual cells adjacent to each other by alternating vacuum electronics cells and p-type thermoelectric legs in a thermionic array. Electrical insulator 530, which facilitates the electrical insulation of P-type thermoelectric leg 535, may be implemented by a dielectric coating. In one embodiment, the dielectric coating may be deposited by chemical vapor deposition (CVD) or atomic layer deposition (ALD). Exemplary materials for the dielectric coating include silica, alumina, or titania.

Low temperature substrate 540 and low temperature heat exchanger 545 are both similar in design and description to low temperature substrate 435 and low temperature heat exchanger 440, shown in FIG. 4. Accordingly, a plurality of TIG structures 400, shown in FIG. 4 may be disposed side by side to create a thermionic array of a TIG shown in FIG. 5.

Figure 6:
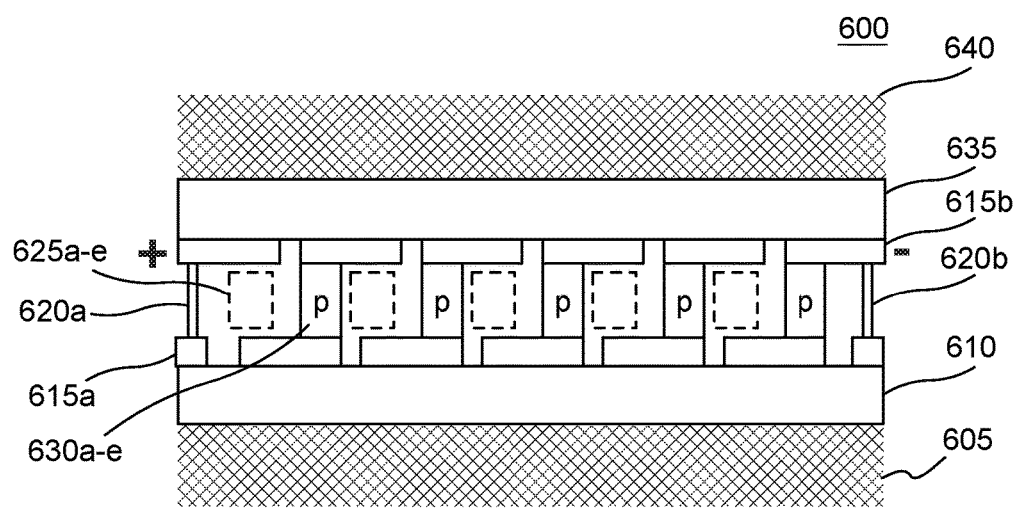
FIG. 6 illustrates an exemplary thermionic array of thermionic energy converters in a TIG.

FIG. 6 illustrates an exemplary thermionic array of thermionic energy converters in a TIG 600. TIG 600 includes a high temperature heat exchanger 605 which is similar in design and description to high temperature heat exchanger 505, shown in FIG. 5. TIG 600 includes a high temperature substrate 610 which is also similar in design and description to high temperature substrate 510, shown in FIG. 5. TIG 600 also includes refractory metals 615a and 615b which are similar to refractory metals 515a, 515b, and 515c, shown in FIG. 5. However, in the embodiment of TIG 600, a plurality of refractory metals 615a is deposited on high temperature substrate 610, while a corresponding plurality of refractory metals 615b is disposed on low temperature substrate 635.

TIG 600 implements an array of thermionic energy converters by disposing a plurality of vacuum electronics cells 625a-e and a plurality of P-type thermoelectric legs 630a-e between refractory metals 615a and 615b. Each P-type thermoelectric leg 630a-e within TIG 600 may be insulated as described above with respect to FIG. 5. Further, the vacuum electronics cells 625a-e are sealed by a low thermal conductance material 620a and 620b. In one embodiment, low thermal conductance material 620a and 620b may be implemented using materials such as quartz or sapphire.

It should be noted that while five vacuum electronics cells 625a-e and five thermoelectric legs 630a-e are shown in TIG 600, any number of vacuum electronics cells and thermoelectric legs may be implemented in practice. In FIG. 6, a positive voltage and a negative voltage are provided by TIG 600 as thermal energy is exposed to high temperature heat exchanger 605.

TIG 600 further includes low temperature substrate 635 and low temperature heat exchanger 640 which are both similar in design and description to low temperature substrate 540 and low temperature heat exchanger 545, shown in FIG. 5. TIG 600 may be disposed in a hermetically sealed package and configured to receive, via high temperature heat exchanger 605, thermal energy from the exhaust of a UAV. In some embodiments, one or more TIGs 600 may be used as a sole source of propulsion power for an aerial vehicle and receive both radiation from the combustor and thermal energy from the exhaust gases, as will be further discussed below.

Figure 7:
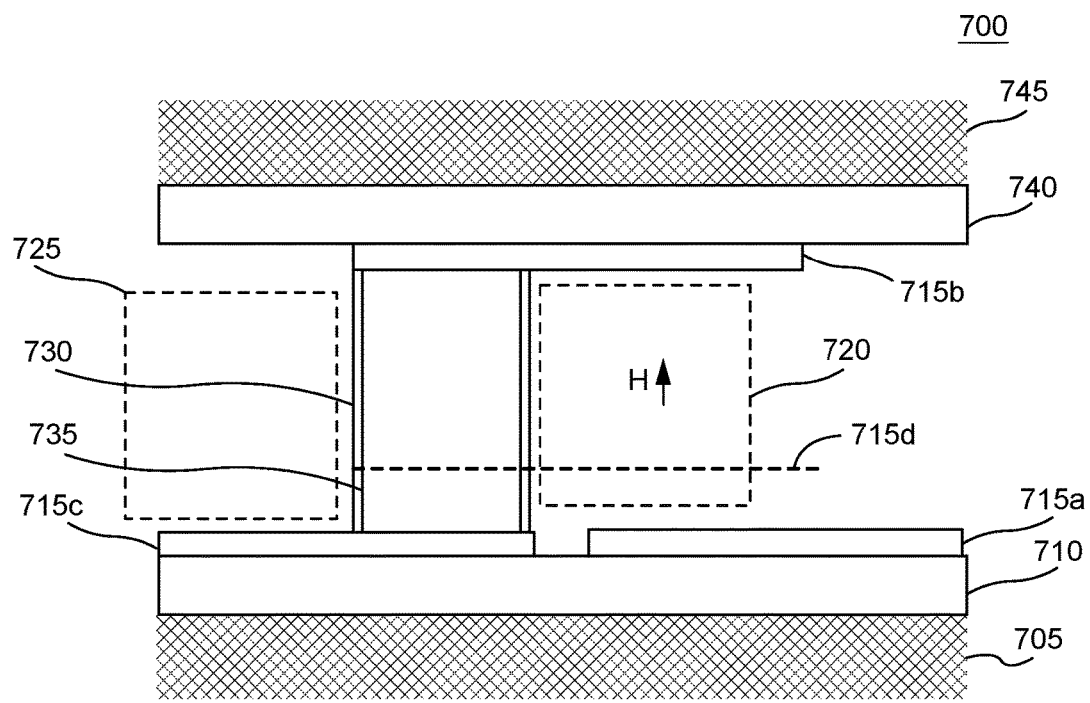
FIG. 7 illustrates an exemplary thermionic array of thermionic energy converters in a TIG with increased efficiency.

FIG. 7 illustrates an exemplary thermionic array of thermionic energy converters in a TIG 700 with increased efficiency. TIG 700 includes a high temperature heat exchanger 705, which is similar in design and description to high temperature heat exchanger 605, shown in FIG. 6. TIG 700 further includes a high temperature substrate 710 which is similar in design and description to high temperature substrate 610, shown in FIG. 6. TIG 700 includes refractory metals 715a, 715b, and 715c, which are similar in design and description to refractory metals 515a, 515b, and 515c, shown in FIG. 5. In the embodiment of FIG. 7, TIG 700 includes a metallic grid or metallic mesh 715d which may be constructed using the same refractory metals used to implement refractory metals 715a, 715b, and 715c.

TIG 700 further includes a vacuum electronics cell 720 which experiences a magnetic field created by a magnet H. Magnet H may be disposed within TIG 700 or may be external to TIG 700 and is typically a rare earth magnet. One example of a rare earth magnet may be an NdFeB (Neodymium, Iron, Boron) magnet or Samarium Cobalt (SmCo) magnet. The positive electric potential of metallic mesh 715d (relative to the cathode defined by refractory metal 715a) eliminates the space charge within vacuum electronics cell 720 while the magnetic field H provides helical transport paths for the electrons and results in high transmission coefficient through the metallic mesh 715d. Results have shown that TIG 700, when exposed to a magnetic field provided by magnet H, increases thermionic energy conversion efficiency to more than 60% of the ideal Carnot efficiency. The ideal Carnot efficiency c of an heat engine operating between the hot reservoir at temperature $T_{hot}$ and a cold reservoir at temperature $T_{cold}$ is given by the expression $\varepsilon = (T_{hot} - T_{cold})/T_{hot}$ TIG 700 includes a second vacuum cell 725 which is similar in design and description to vacuum cell 525, shown in FIG. 5. Although, second vacuum cell 725 may also include a magnet H or may otherwise be exposed to a magnetic field in FIG. 7. TIG 700 also includes electric insulator 730 disposed on P-type thermoelectric leg 735 in a fashion similar to electric insulator 530 and thermoelectric leg 535, shown in FIG. 5. P-type thermoelectric leg 735 may provide an electrical bias for metallic mesh 715d or TIG 700 may include an external electrode to provide the appropriate electrical bias for metallic mesh 715d.

TIG 700 also includes a low temperature substrate 740 and a low temperature heat exchanger 745 which are both similar in design and description to low temperature substrate 540 and low temperature heat exchanger 545, shown in FIG. 5. Accordingly, TIG 700 may increase the thermal conversion efficiency of heat to electricity when implemented within the exhaust channel of a UAV.

Figure 8:
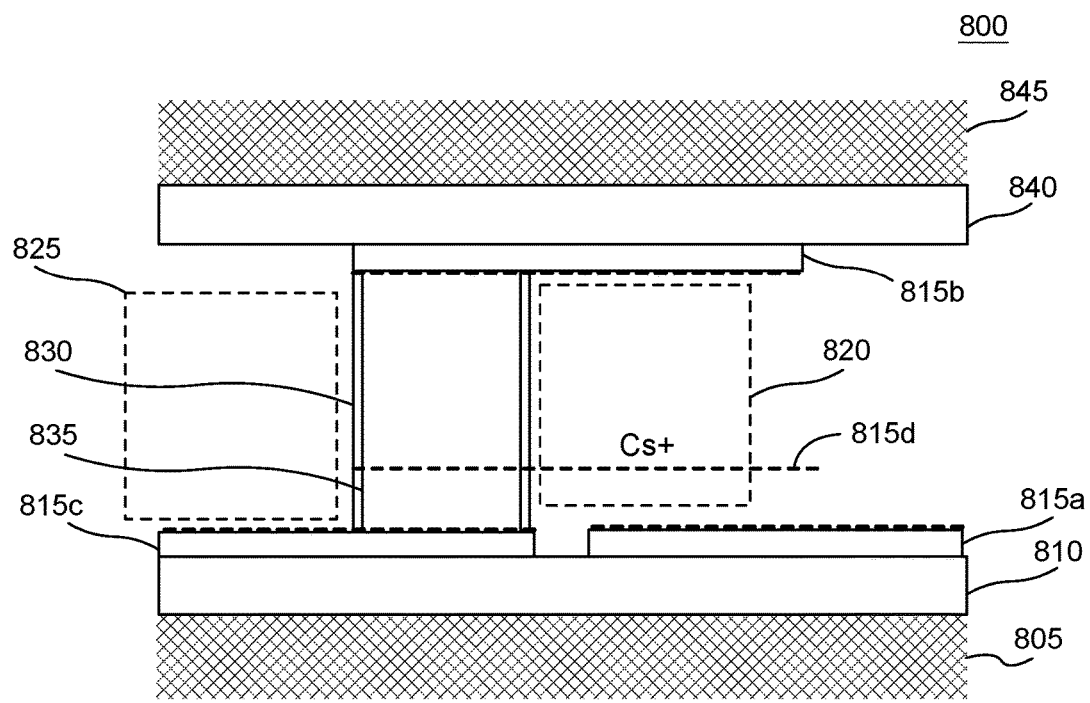
FIG. 8 illustrates a second embodiment of an exemplary thermionic array of thermionic energy converters in a TIG with increased efficiency.

FIG. 8 illustrates a second embodiment of an exemplary thermionic array of thermionic energy converters in a TIG 800 with increased efficiency. TIG 800 includes a high temperature heat exchanger 805 which is similar in design and description to high temperature heat exchanger 705, shown in FIG. 7. TIG 800 further includes a high temperature substrate 810 which is similar in design and description to high temperature substrate 710, shown in FIG. 7. TIG 800 further includes refractory metals 815a, 815b, and 815c which are similar to refractory metals 715a, 715b, and 715c shown in FIG. 7. However, in the embodiment of TIG 800, refractory metals 815a, 815b, and 815c are coated with a graphene coating, which as described below, helps prevent degradation of refractory metals 815a, 815b, and 815c. Also, in the embodiment of TIG 800, a metal mesh 815d, which is similar in design and description to metal mesh 715d shown in FIG. 7, is implemented.

Metal mesh 815d may be pre-coated with Cesium (Cs) at ambient temperatures and biased at positive electric potential relative to the cathode defined by refractory metal 815a. At high temperatures, and in operation, positive cesium ions (Cs+) are created by impact ionization of electrons with Cesium (Cs) atoms in the vicinity of metal mesh 815d. The positive cesium ions neutralize the electron space charge region and permit efficient electron transport. In this way, the thermionic energy conversion efficiency again exceeds 60% of ideal Carnot efficiency without the need of a magnet or a magnetic field, as described above with respect to FIG. 7. Cesium may degrade metals within TIG 800 at high temperatures. However, coating refractory metals 815a, 815b, and 815c with graphene prevents metal degradation while retaining the benefits of cesium ions within TIG 800.

TIG 800 includes a second vacuum cell 825 which is similar in design and description to vacuum cell 725, shown in FIG. 7. Although, second vacuum cell 825 may also include a metal mesh 815d. TIG 800 also includes electric insulator 830 disposed on P-type thermoelectric leg 835 in a fashion similar to electric insulator 730 and thermoelectric leg 735, shown in FIG. 7. P-type thermoelectric leg 835 may provide an electrical bias for metallic mesh 815d or TIG 800 may include an external electrode to provide the appropriate electrical bias for metallic mesh 815d.

Figure 9:
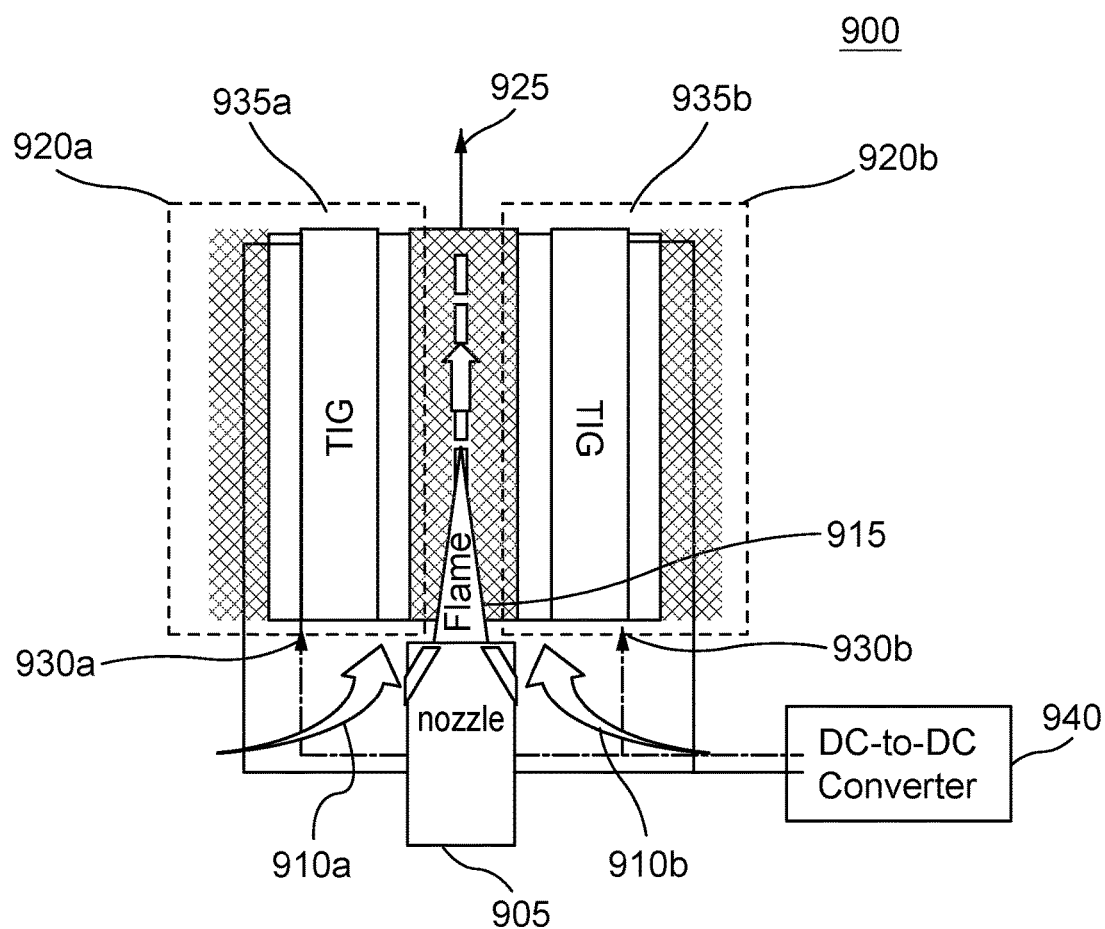
FIG. 9 illustrates a TIG microengine.

FIG. 9 illustrates a TIG microengine 900. TIG microengine 900 includes a nozzle 905 that entrains air through air intakes 910a and 910b to a flame 915. In the example of FIG. 9, two TIGs are implemented, TIG 920a and TIG 920b which may be implemented using any embodiment for a TIG or TIG structure described herein. It should be noted that TIG 920a and TIG 920b are implemented for purposes of discussion and explanation. TIG microengine 900 may include a single TIG or a plurality of TIGs. Exhaust gases 925 flow out from flame 915 through guided Silicon Carbide (SiC), Silicon (Si), or refractory foam channels disposed between TIG 920a and TIG 920b as flame 915 burns fuel.

Nozzle 905, air intakes 910a and 910b, and flame 915 may be included in, for example, a combustor such as combustor 125, shown in FIG. 1.

One or more TIG structures within TIG 920a or 920b produce electricity as described in the foregoing embodiments. The temperature difference between the hot side and the cold side of the TIG 920a and TIG 920b provide a positive voltage at positive voltage terminals 930a and 930b, respectively relative to the voltage terminals 935a and 935b, respectively. A DC-DC converter 940, which is similar in design and discussion to DC-DC converter 140 shown in FIG. 1, may be connected to the positive voltage terminals 930a and 930b and to negative voltage terminals 935a and 935b of TIG 920a and TIG 920b.

The high temperature heat exchangers within TIG 920a and 920b are heated by flame 915 and exhaust 925 while the low temperature heat exchangers within TIG 920a and 920b are cooled by ambient air surrounding TIG microengine 900. Electrical power generated by TIG 920a and 920b is provided to DC-DC converter 940 to provide electricity at a proper voltage and current level to one or more propulsion motors or optional batteries within a UAV.

TIG microengine 900 enjoys a relatively lightweight implementation compared to other types of electrical generators, such as a TPV. Further, conversion efficiencies of heat to electricity greater than approximately 60% of the ideal Carnot efficiency is equivalent to specific energy greater than 5000 Wh/kg for combustion of butane and more than 10,000 Wh/kg for combustion of hydrogen. More simply put, the specific energy of a TIG engine is approximately twenty times better than LiPo batteries.

Figure 10:
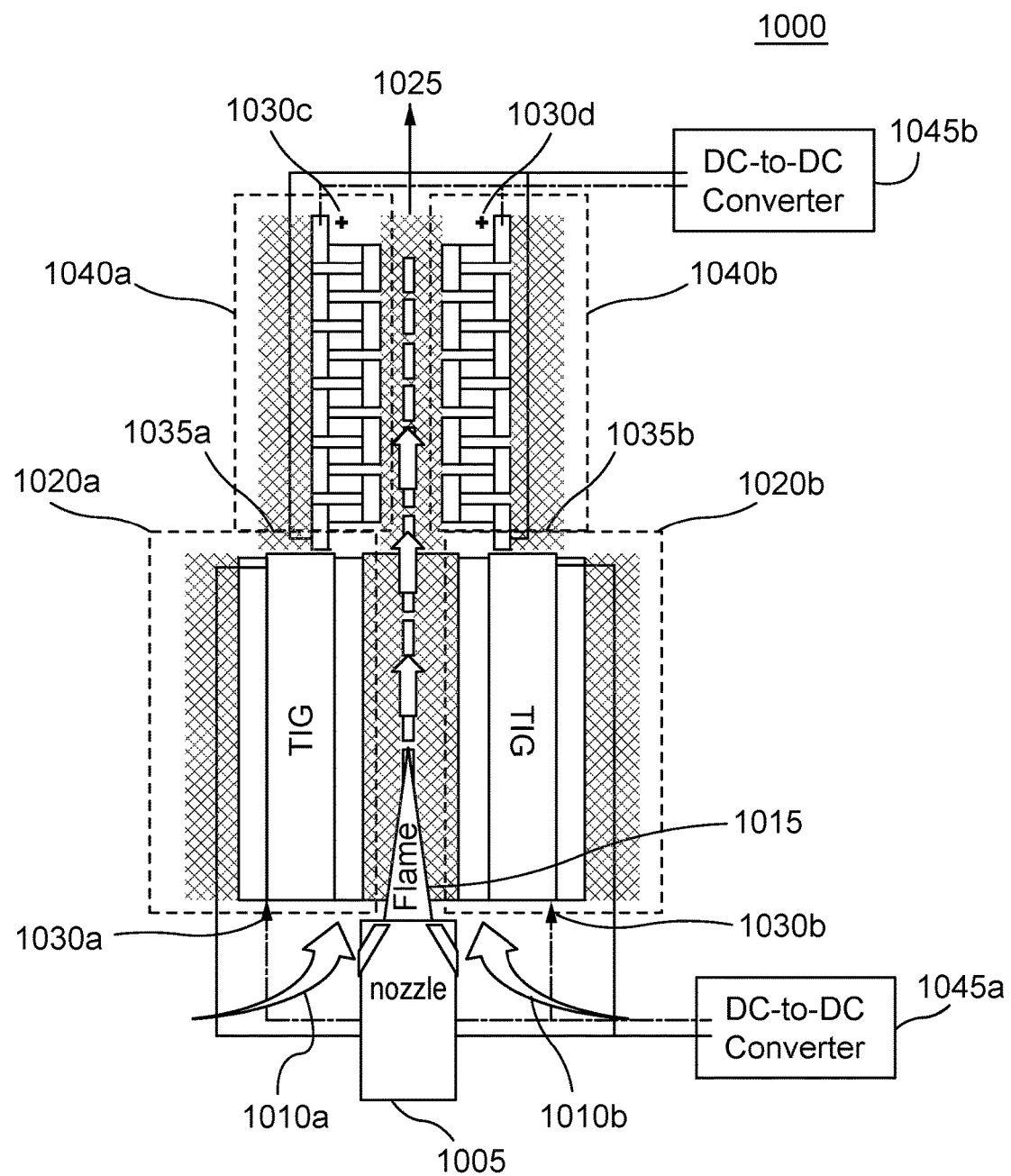
FIG. 10 illustrates a hybrid TIG/TEG microengine.

FIG. 10 illustrates a hybrid TIG/TEG microengine 1000. TIG/TEG microengine 1000 includes a nozzle 1005, air intakes 1010a and 1010b, and a flame 1015. In the example of FIG. 10, two TIGs and two TEGs are implemented, TIG 1020a and TIG 1020b and TEG 1040a and TEG 1040b, which may be implemented using any embodiment for a TIG or TEG structure described herein. It should be noted that TIG 1020a, TIG 1020b, TEG 1040a, and TEG 1040b are implemented for purposes of discussion and explanation. TIG microengine 1000 may include a single TIG or a plurality of TIGs and a single TEG or a plurality of TEGs. Exhaust gases 1025 flow out from flame 1015 through guided Silicon Carbide (SiC) or Silicon (Si) or metallic foam channels disposed between TIG 1020a and TIG 1020b and TEG 1040a and TEG 1040b as flame 1015 burns fuel. Nozzle 1005, air intakes 1010a and 1010b, and flame 1015 may be included in, for example, a combustor such as combustor 125, shown in FIG. 1. In FIG. 10, both TIGs 1020a and 1020b and TEGs 1040a and 1040b are implemented for optimal operation. For example, because TIGs 1020a and 1020b experience higher temperatures (up to approximately 1500°) because of their relative proximity to flame 1015, TIGs 1020a and 1020b are optimized for higher temperature operation. TEGs 1040a and 1040b may be optimized for relatively lower temperatures (up to approximately 600°) because of their relative distance from flame 1015. The term "optimized" means using materials that are suitable to produce the maximum amount of electricity in a given temperature range.

TIGs 1030a and 1030b provide positive voltage terminals 1030a and 1030b, respectively. TEGs 1040a and 1040b provide positive voltage terminals 1030c and 1030d, respectively. Both TIGs 1030a and 1030b and TEGs 1040a and 1040b share common negative voltage terminals 1035a and 1035b in one embodiment. TIGs 1030a and 1030b and TEGs 1040a and 1040b may also provide individual negative voltage terminals. In one embodiment, positive voltage terminals 1030a and 1030b and negative voltage terminals 1035a and 1035b may be connected to a DC-DC converter 1045a while positive voltage terminals 1030c and 1030d and negative voltage terminals 1035a and 1035b may be connected to a second DC-DC converter 1045b. Both DC-DC converters 1045a and 1045b may be implemented in a manner similar to DC-DC converter 140, shown in FIG. 1, and provide electrical power at an appropriate voltage and current to one or more propulsion motors or optional batteries within the UAV. It should be noted that TIG/TEG microengine 1000 may be implemented with a single DC-DC converter.

Figure 11:
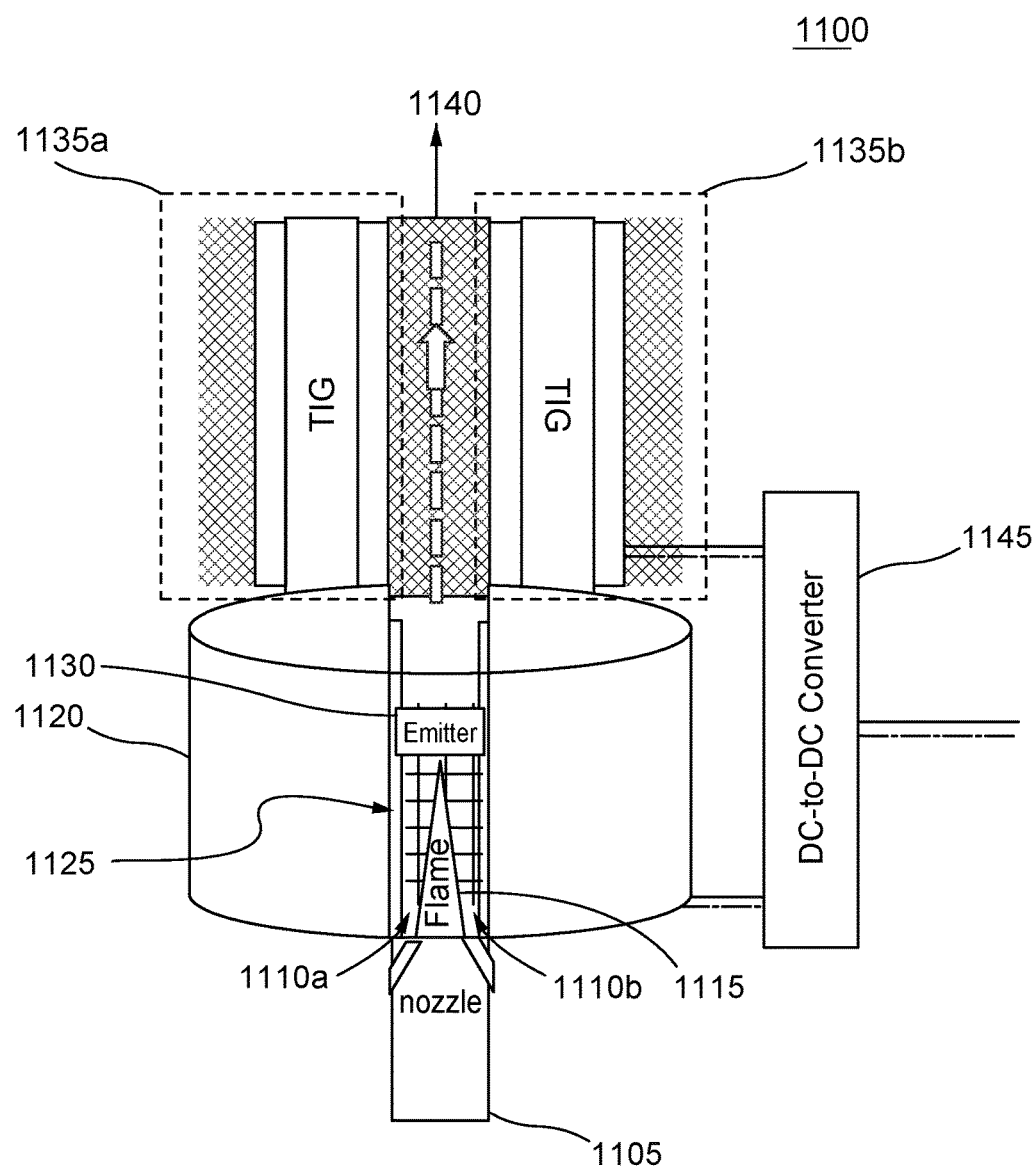
FIG. 11 illustrates a hybrid TPV/TEG microengine.

FIG. 11 illustrates a hybrid TPV/TIG microengine 1100. TPV/TIG microengine 1100 includes a nozzle 1105 that is used with air intakes 1110a and 1110b to entrain air for combustion in flame 1115. In this embodiment, a photovoltaic array 1120 is arranged in a cylindrical shape around an exhaust tube 1125, which may be constructed using, for example, sapphire to provide better thermal isolation between the emitter and the photovoltaic array 1120. Photovoltaic array 1120 receives radiation (e.g., light radiation) from an emitter 1130. Emitter 1130 is composed of a mesh of rare earth oxide such as ytterbia. Emitter 1130 is similar in implementation to emitter 215 discussed above with respect to FIG. 2. Radiation is emitted from emitter 1130 and which is converted into electricity by photovoltaic array 1120.

TPV/TIG microengine 1100 further includes two TIGs, TIG 1135a and TIG 1135b. While TIG 1135a and TIG 1135b are shown in FIG. 11, any number of TIGs may be implemented in TPV/TIG microengine 1100. TIG 1135a and TIG 1135b receive heat from exhaust 1140 of flame 1115. Accordingly, TIG 1135a and TIG 1135b convert the remaining fraction of heat from exhaust 1140 into electricity using any of the techniques described herein. The electricity generated by photovoltaic array 1120a and by TIG 1135a and TIG 1135b is provided to one or more DC-DC converters 1145 to produce electrical power at a proper voltage and current level to one or more propulsion motors or optional batteries within a UAV.

The foregoing description has been presented for purposes of illustration. It is not exhaustive and does not limit the invention to the precise forms or embodiments disclosed. Modifications and adaptations will be apparent to those skilled in the art from consideration of the specification and practice of the disclosed embodiments. For example, components described herein may be removed and other components added without departing from the scope or spirit of the embodiments disclosed herein or the appended claims.

Other embodiments will be apparent to those skilled in the art from consideration of the specification and practice of the disclosure disclosed herein. It is intended that the specification and examples be considered as exemplary only, with a true scope and spirit of the invention being indicated by the following claims.

What is claimed is:

1. A propulsion system, comprising:
   a microengine, comprising:
      a combustor disposed in the microengine of an aerial vehicle, and
      a thermionic generator disposed in the microengine of the aerial vehicle that receives heat from the combustor and uses the heat to generate electricity, the thermionic generator including a plurality of thermionic cells having a plurality of thermoelectric legs which are implemented as only P-type thermoelectric legs where the plurality of thermionic cells are connected in an electrically series thermally parallel array of thermionic cells; and one or more electric propulsion motors disposed outside the microengine and in the aerial vehicle that receive the electricity generated by the thermionic generator in the microengine to drive one or more propellers a magnetic field applied to a vacuum electronics cell; and a metallic mesh disposed within the magnetic field which neutralizes a space charge within the vacuum electronics cell, wherein the metallic mesh is biased by one or more of the plurality of P-type thermoelectric legs.

2. The system of claim 1, wherein the combustor exhausts gases to the thermionic generator.

3. The system of claim 1, wherein the thermionic generator includes a high temperature heat exchanger thermally connected to a high temperature substrate.

4. The system of claim 3, wherein a first refractory metal is thermally connected to the high temperature substrate and wherein a second refractory metal is thermally bonded to the high temperature substrate and wherein the first refractory metal and the second refractory metal are electrically separated.

5. The system of claim 4, wherein the vacuum electronics cell is created between the first refractory metal and a third refractory metal.

6. The system of claim 5, wherein the third refractory metal is thermally connected to a low temperature substrate and wherein the low temperature substrate is thermally connected to a low temperature heat exchanger.

7. The system of claim 5, wherein the plurality of thermoelectric legs are electrically connected to the second refractory metal and the third refractory metal.

8. The system of claim 7, wherein the plurality thermoelectric legs further include an electrical insulator.

9. The system of claim 8, wherein positive cesium ions are present within the vacuum electronics cell.

10. The system of claim 9, wherein the first refractory metal, the second refractory metal, and the third refractory metal are at least partially coated with graphene.

11. The propulsion system of claim 1, wherein the metallic mesh is coated with graphene.

12. The propulsion system of claim 1, wherein the array of thermionic cells is vacuum sealed.

13. The propulsion system of claim 1, wherein the thermionic generator further includes:

the metallic mesh being coated with cesium, wherein the cesium on the metallic mesh, when heated, creates positive cesium ions by impact ionization with electrons with cesium on the metallic mesh, which neutralizes the space charge in the vacuum cell.

* * * * *